(12) United States Patent
Ogura et al.

(10) Patent No.: US 11,452,972 B2
(45) Date of Patent: Sep. 27, 2022

(54) PRECISION FILTER TO FILTER PROCESS LIQUID FOR PRODUCING CIRCUIT BOARDS

(71) Applicant: W. L. Gore & Associates G.K., Tokyo (JP)

(72) Inventors: Tomoka Ogura, Tokyo (JP); Hidesato Mano, Tokyo (JP)

(73) Assignee: W. L. Gore & Associates G.K., Tokyo (JP)

( * ) Notice: Subject to any disclaimer, the term of this patent is extended or adjusted under 35 U.S.C. 154(b) by 39 days.

(21) Appl. No.: 15/741,994

(22) PCT Filed: Aug. 4, 2016

(86) PCT No.: PCT/JP2016/072997
§ 371 (c)(1),
(2) Date: Jan. 4, 2018

(87) PCT Pub. No.: WO2017/022836
PCT Pub. Date: Feb. 9, 2017

(65) Prior Publication Data
US 2018/0193805 A1    Jul. 12, 2018

(30) Foreign Application Priority Data
Aug. 4, 2015  (JP) .............................. JP2015-154539

(51) Int. Cl.
*B01D 69/10* (2006.01)
*B01D 71/36* (2006.01)
(Continued)

(52) U.S. Cl.
CPC ............. *B01D 69/10* (2013.01); *B01D 69/02* (2013.01); *B01D 71/36* (2013.01); *H01L 21/304* (2013.01);
(Continued)

(58) Field of Classification Search
None
See application file for complete search history.

(56) References Cited

U.S. PATENT DOCUMENTS 4,030,988 A * 6/1977 Grot .................... B01D 67/0083
205/520
4,470,859 A * 9/1984 Benezra .................... C25B 9/23
156/155
(Continued)

FOREIGN PATENT DOCUMENTS

CN          1255876 A      6/2000
EP          0087170 A2 *   8/1983  ............ C08J 5/2237
(Continued)

*Primary Examiner* — Magali P Slawski
*Assistant Examiner* — Brad Gordon

(57) ABSTRACT

The objective of the present invention is to provide a precision filter which is suitable for filtering a circuit board production process liquid, which is extremely excellent in the resistance to both a strongly acidic cleaning liquid and a strongly alkaline cleaning liquid and which is extremely excellent in the capability of removing an extremely fine foreign substance. Also, the objective of the present invention is to provide a precision filter cartridge which is used for a circuit board production process liquid and which includes the precision filter. Further, the objective of the present invention is to provide a method for producing a circuit board using the process liquid filtered by the precision filter for a circuit board production process liquid or the precision filter cartridge for a circuit board production process liquid. The precision filter to filtrate a process liquid for producing a circuit board according to the present invention is characterized in comprising a tetrafluoroethylene copolymer (I) having an amino group in a side chain.

4 Claims, 4 Drawing Sheets

(51) Int. Cl.
  *B01D 69/02* (2006.01)
  *B01D 69/12* (2006.01)
  *H01L 21/304* (2006.01)
  *H05K 3/06* (2006.01)
  *B01D 71/76* (2006.01)
  *H05K 3/00* (2006.01)

(52) U.S. Cl.
  CPC ............... *H05K 3/06* (2013.01); *B01D 69/12* (2013.01); *B01D 71/76* (2013.01); *B01D 2325/16* (2013.01); *H05K 3/0085* (2013.01)

(56) References Cited

U.S. PATENT DOCUMENTS

| | | | |
|---|---|---|---|
| 4,473,474 A | | 9/1984 | Ostreicher et al. |
| 4,539,113 A | * | 9/1985 | Tomita ................. B01D 39/163 |
| | | | 210/323.2 |
| 4,673,504 A | | 6/1987 | Ostreicher et al. |
| 4,708,803 A | | 11/1987 | Ostreicher et al. |
| 4,711,793 A | | 12/1987 | Ostreicher et al. |
| 4,765,905 A | * | 8/1988 | Kitamura ............... C08J 5/2237 |
| | | | 210/644 |
| 5,004,543 A | * | 4/1991 | Pluskal ............. B01D 67/0088 |
| | | | 210/490 |
| 5,130,024 A | | 7/1992 | Fujimoto et al. |
| 5,282,971 A | | 2/1994 | Degen et al. |
| 6,273,271 B1 | | 8/2001 | Moya |
| 6,354,443 B1 | | 3/2002 | Moya |
| 6,780,327 B1 | | 8/2004 | Wu et al. |
| 6,849,185 B1 | | 2/2005 | Wu et al. |
| 2003/0175523 A1 | | 9/2003 | Moya |
| 2004/0251193 A1 | | 12/2004 | Wu et al. |
| 2005/0211621 A1 | | 9/2005 | Wu et al. |
| 2006/0151374 A1 | | 7/2006 | Wu et al. |
| 2006/0249445 A1 | | 11/2006 | Wu et al. |
| 2007/0207493 A1 | * | 9/2007 | Wu ................... B01D 67/0088 |
| | | | 435/6.12 |
| 2010/0248324 A1 | | 9/2010 | Xu et al. |
| 2010/0280200 A1 | | 11/2010 | Tarun |
| 2010/0320142 A1 | | 12/2010 | Ge et al. |
| 2011/0039960 A1 | | 2/2011 | Drumheller et al. |
| 2011/0127212 A1 | * | 6/2011 | Ishizuka ............ B01D 67/0093 |
| | | | 210/493.5 |
| 2011/0210063 A1 | | 9/2011 | Ge et al. |
| 2012/0184637 A1 | | 7/2012 | Chen et al. |
| 2013/0004690 A1 | | 1/2013 | Mikhael et al. |
| 2013/0084460 A1 | | 4/2013 | Xu et al. |
| 2013/0203874 A1 | | 8/2013 | Xu et al. |
| 2013/0203875 A1 | | 8/2013 | Xu et al. |
| 2013/0210944 A1 | | 8/2013 | Xu et al. |
| 2013/0310246 A1 | | 11/2013 | Oldani et al. |
| 2014/0005286 A1 | | 1/2014 | Xu et al. |
| 2014/0018457 A1 | | 1/2014 | Xu et al. |
| 2014/0048476 A1 | | 2/2014 | Ge et al. |
| 2015/0045524 A1 | | 2/2015 | Xu et al. |

FOREIGN PATENT DOCUMENTS

| | | | |
|---|---|---|---|
| JP | S57501855 | | 10/1932 |
| JP | H01224009 | | 9/1989 |
| JP | H04139237 | | 5/1992 |
| JP | H04139237 A | * | 5/1992 |
| JP | H05-131124 A | | 5/1993 |
| JP | H05131124 | | 5/1993 |
| JP | H0788342 | | 4/1995 |
| JP | 2000512904 | | 10/2000 |
| JP | 2002537106 | | 11/2002 |
| JP | 2002543971 | | 12/2002 |
| JP | 2003522225 | | 7/2003 |
| JP | 2003251120 A | * | 9/2003 |
| JP | 2011131208 | | 7/2011 |
| JP | 2012521480 | | 9/2012 |
| JP | 2013538281 | | 10/2013 |
| JP | 2014503023 | | 2/2014 |
| JP | 2014057956 | | 4/2014 |
| JP | 2014525847 | | 10/2014 |
| KR | 10-0341259 B1 | | 6/2002 |

* cited by examiner

PRECISION FILTER TO FILTER PROCESS LIQUID FOR PRODUCING CIRCUIT BOARDS

This application is a U.S. National Stage of International Application No. PCT/JP2016/072997, filed on Aug. 4, 2016, which claims priority from Japanese Application No. JP2015-154539, filed on Aug. 4, 2015, the entire contents of which are incorporated herein by reference.

TECHNICAL FIELD

The present invention relates to a precision filter which is extremely excellent in resistance and which is suitable for filtering a process liquid for producing a circuit board, a precision filter cartridge which includes the precision filter and which is used for filtering a process liquid for producing a circuit board, and a method for producing a circuit board using the process liquid filtered by the precision filter to filtrate a process liquid for producing a circuit board or the precision filter cartridge to filtrate a process liquid for producing a circuit board.

BACKGROUND ART

In the past, a circuit board was produced by mounting a semiconductor element or the like on a circuit. In recent years, however, a circuit board is produced by directly forming a semiconductor element on a circuit in accordance with a demand for integration or scale reduction of a circuit board. For example, a transistor is formed at a specific position on a circuit of a circuit board by directly forming a source, a drain, a gate, an oxide film, a contact hole and the like. A photolithography technique is applied to a direct formation of a transistor. When a semiconductor element is directly formed on a circuit, as a developing liquid for removing a resist or as a cleaning liquid used for cleaning after stripping a resist, a liquid containing a component which is so strong that a filter to filtrate such production process liquids is damaged is sometimes used.

For example, as a developing liquid for photolithography, an aqueous solution of an organic alkali or an inorganic alkali in addition to an organic solvent which can dissolve a resist are used. In addition, sulfuric acid, hydrochloric acid, nitric acid, a mixed liquid of the acids and hydrogen peroxide, or the like is used for removing a metal component or an organic substance. In order to remove a fine particle and a process residue, ammonia water, an aqueous solution containing ammonia and hydrogen peroxide, or the like is used.

In a recent integrated circuit, an interval between circuits is becoming further narrower, and it is expected that a circuit interval would be several nanometers in the future. When a foreign substance remains on a circuit surface during production process of such an integrated circuit, the foreign substance may become a cause of short-circuiting. Accordingly, a contamination of a foreign substance having even a size of half of a circuit interval is not permitted in a cleaning liquid for cleaning a circuit board.

However, when a filter becomes deteriorated by a strong production process liquid, the filtration performance thereof decreases. As a result, a production process liquid is contaminated by a foreign substance which may become a cause of short-circuiting. Accordingly, a high resistance to both an acidic cleaning liquid and an alkaline cleaning liquid is demanded in a filter for a circuit board production process liquid.

As a filtration material used for filtrating a production process liquid of a circuit board, Patent Document 1 discloses a halogenated polyolefin micropore membrane which is modified by an ordinary-pressure microwave plasma. Patent Document 1 also describes use of the membrane for removing a particle from an SC1 cleaning bath or an SC2 cleaning bath in a wafer cleaning device. SC1 is another name for an aqueous solution containing ammonia and hydrogen peroxide, and SC2 is another name for a mixed liquid of hydrochloric acid and hydrogen peroxide water. However, though Patent Document 1 discloses a test result of wettability to the liquid to be processed, the liquid which is used therein is only a deionized water and methanol, and a strongly acidic solution or a strongly alkaline solution is not used. In a plasma-radiated membrane, at least the molecules on the surface are broken, though the wettability is improved. It is therefore hardly conceivable that the plasma-radiated membrane exhibits resistance to a strongly acidic solution or a strongly alkaline solution. Also, there is no description of the resistance to a cleaning liquid in Patent Document 1.

In addition, Patent Documents 2 and 3 disclose a charged membrane for reducing a bacterial contaminant such as an endotoxin and a nucleic acid, though the charged membrane is not used for filtering a circuit board production process liquid. The microporous membrane described in Patent Document 2 is produced by cross-linking a hydrophilic porous base by a coating membrane having a side-chain cation group, and such a side-chain cation group is exemplified by a quaternary ammonium group. The hydrophilic charged microporous membrane described in Patent Document 3 is constituted of a porous hydrophobic base and a coating membrane containing a positive charge donor, and such a positive charged donor is exemplified by a positively charged polymer having a quaternary ammonium group.

Also, Patent Document 4 discloses a microporous polyvinylidene fluoride membrane to which a quaternary ammonium group is bonded by a covalent bond. However, the membrane is used for filtering a liquid agent for ophthalmology, and an antiseptic agent, a bacteriostatic agent and the like, such as benzalkonium chloride, which are positively charged, can pass through the membrane.

Patent Document 5 discloses a porous polymer material obtained from a tetrafluoroethylene copolymer which has a tetrafluoroethylene main chain and a side-chain functional group. However, it is intended therein that the side-chain functional group is bonded by a biochemical substance such as an enzyme and a nucleic acid. Also, Patent Document 6 discloses a functional tetrafluoroethylene copolymer fine powder resin made of a similar material and a stretched polymer substance. However, it is also intended therein that the functional group is bonded by a biological active species such as heparin.

Patent Document 7 discloses a liquid composition which contains a fluorinated anion-exchange polymer having a fluorocarbon main chain and a quaternary ammonium group. However, the liquid composition is applied onto a support in order to form an ion-exchange membrane and an electric catalyst layer in a fuel battery and a metal ion battery.

Patent Document 8 discloses a microporous membrane made of nylon or the like which is subjected to cationic charge reforming by a tertiary amino group or a quaternary ammonium group. However, such a microporous membrane is used for removing bacteria, viruses and the like from a biological liquid and a liquid for non-oral administration.

PRIOR ART DOCUMENT

Patent Document

[Patent Document 1] JP 2014-57956 A
[Patent Document 2] JP 2002-537106 T
[Patent Document 3] JP 2002-543971 T
[Patent Document 4] JP H7-88342 A
[Patent Document 5] JP 2012-521480 T
[Patent Document 6] JP 2013-538281 T
[Patent Document 7] JP 2014-503023 T
[Patent Document 8] JP S57-501855 T

DISCLOSURE OF THE INVENTION

Problems to be Solved by the Invention

As described above, a filter which is used for filtering a production process liquid for a circuit board has been known. Such a filter is required to be resistant, since some production process liquids are strongly acidic or strongly alkaline. A filter made of fluororesin, which is highly resistant, is considered to be suitable for filtering a strongly acidic or strongly alkaline production process liquid. However, since a fluororesin filter is hydrophobic, foams tend to adhere to the filter. As a result, an effective filtration area of the filter is disadvantageously decreased to lower the filtration performance. Thus, a fluororesin filter having an enhanced hydrophilicity by a plasma treatment or an ionomer coating has been developed; however, the resistance thereof is not sufficient.

Thus, there has not been so far a filter which is used for filtering a circuit board production process liquid and which is excellent in both resistance and filtration performance. In recent years, there is an increasing demand for circuit board performance, and the contamination of even a foreign substance of several nanometers is not permitted, so that a filter which has a high resistance to strongly acidic and strongly alkaline cleaning liquids and of which decrease of filtration performance is inhibited is demanded.

Accordingly, the objective of the present invention is to provide a precision filter which is suitable for filtering a circuit board production process liquid, which is extremely excellent in the resistance to both a strongly acidic cleaning liquid and a strongly alkaline cleaning liquid and which is extremely excellent in the capability of removing an extremely fine foreign substance. Also, the objective of the present invention is to provide a precision filter cartridge which is used for a circuit board production process liquid and which includes the precision filter. Further, the objective of the present invention is to provide a method for producing a circuit board using the process liquid filtered by the precision filter for a circuit board production process liquid or the precision filter cartridge for a circuit board production process liquid.

Means for Solving the Problems

The inventors of the present invention repeated intensive studies in order to solve the above-described problems. As a result, the present inventors found that, by constructing a filter with a tetrafluoroethylene copolymer (I) having an amino group in a side chain, the filter which exhibits a high resistance to both a strongly acidic cleaning liquid and a strongly alkaline cleaning liquid, which is excellent in the wettability to a circuit board production process liquid and which is excellent in the capturing capability to a fine foreign substance which raise a problem in a circuit board production process can be obtained, thereby completing the present invention.

Hereinafter, the present invention is described.

[1] A precision filter to filtrate a process liquid for producing a circuit board, comprising a tetrafluoroethylene copolymer (I) having an amino group in a side chain.

[2] The precision filter to filtrate a process liquid for producing a circuit board according to the above [1], wherein the amino group is a primary amino group.

[3] The precision filter to filtrate a process liquid for producing a circuit board according to the above [1], wherein the amino group is a quaternary ammonium group.

[4] The precision filter to filtrate a process liquid for producing a circuit board according to any one of the above [1] to [3], wherein a ratio of the amino group to the tetrafluoroethylene copolymer (I) is not less than 0.1 $\mu$mol/g and not more than 10 mmol/g.

[5] The precision filter to filtrate a process liquid for producing a circuit board according to any one of the above [1] to [4], having a double-layered structure of a base material layer and a coating layer, wherein the coating layer is made of the tetrafluoroethylene copolymer (I).

[6] The precision filter to filtrate a process liquid for producing a circuit board according to the above [5], wherein the base material layer is made of polytetrafluoroethylene.

[7] A precision filter cartridge to filtrate a process liquid for producing a circuit board, comprising the precision filter to filtrate a process liquid for producing a circuit board according to any one of the above [1] to [6].

[8] A method for producing a circuit board, comprising the step of forming one or more selected from the group consisting of a circuit, a semiconductor device and a semiconductor device precursor on a circuit board by using a process liquid for a circuit board production, wherein the process liquid is filtered by the precision filter to filtrate a process liquid for producing a circuit board according to any one of the above [1] to [6] or the precision filter cartridge to filtrate a process liquid for producing a circuit board according to the above [7].

Effect of the Invention

The precision filter for a circuit board production process liquid and a precision filter cartridge for a circuit board production process liquid according to the present invention have a high resistance to a strongly acidic or strongly alkaline liquid for circuit board production process. In addition, the filter has a high wettability to a circuit board production process liquid, and also decrease in the filtration performance by adhesion of foams is inhibited. Also, the filter has a high capturing capability to a fine foreign substance which raise a problem in a circuit board production process. Accordingly, the precision filter for a circuit board production process liquid and the precision filter cartridge for a circuit board production process liquid according to the present invention are suitable for filtering a process liquid used in production of an integrated circuit or the like.

MODE FOR CARRYING OUT THE INVENTION

Figure 1:
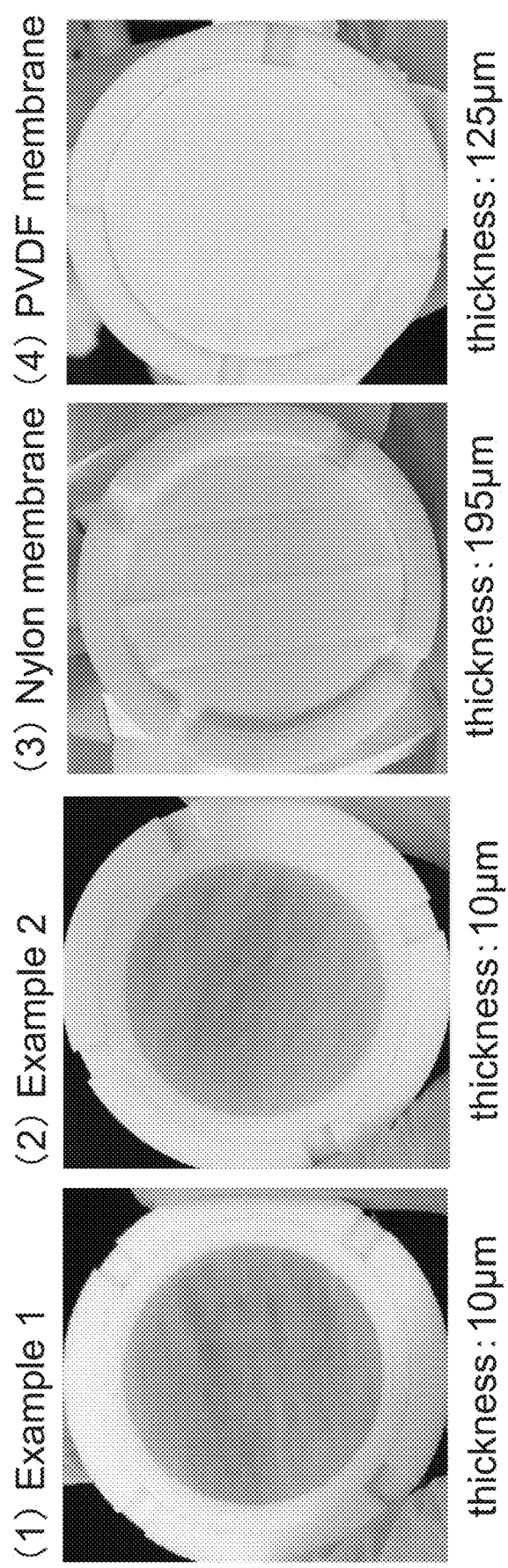
FIG. 1 are photographs of filter samples before immersion into concentrated sulfuric acid or a concentrated aqueous solution of sodium hydroxide.

The tetrafluoroethylene copolymer (I), which is the main raw material of the precision filter for a circuit board production process liquid according to the present invention, has a main chain made of fluorocarbon and has an amino group in a side chain. The tetrafluoroethylene copolymer (I) can be obtained by copolymerizing tetrafluoroethylene with a fluoroolefin which has an amino group or a substituent group containing a precursor group thereof.

In the present invention, the "amino group" represents one or more groups selected from the group consisting of a primary amino group (—$NH_2$), a secondary amino group (—$NHR^1$), a tertiary amino group (—$NR^1R^2$) and a quaternary ammonium group (—$N^+R^1R^2R^3$). In the above formulas, $R^1$ to $R^3$ each independently represent a $C_{1-6}$ alkyl group.

In the present invention, the "$C_{1-6}$ alkyl group" refers to a straight-chain or branched-chain monovalent saturated aliphatic hydrocarbon group of which carbon number is not less than 1 and not more than 6. The $C_{1-6}$ alkyl group may be exemplified by methyl, ethyl, n-propyl, isopropyl, n-butyl, isobutyl, s-butyl, t-butyl, n-pentyl, n-hexyl or the like. The $C_{1-6}$ alkyl group is preferably a $C_{1-4}$ alkyl group and more preferably a $C_{1-2}$ alkyl group.

The quaternary ammonium group may form a salt with an anion. The counter anion may be exemplified by a halide ion such as a chloride ion, a bromide ion and an iodide ion; an organic acid ion such as a carboxylate ion and a sulfonate ion; an inorganic acid ion such as a nitrate ion, a sulfate ion, a perchlorate ion and a tetrafluoroborate ion; a hydroxide ion; a hydrogencarbonate ion and the like.

The number of amino group may be one or not less than two per one side chain. The upper limit of the number is not particularly restricted; however, the number is preferably not more than 10 or not more than 8, and more preferably not more than 5 or not more than 3. Also, the tetrafluoroethylene copolymer (I) may have a side chain which does not contain an amino group as long as the tetrafluoroethylene copolymer (I) has a side chain which contains an amino group. The amino groups that the tetrafluoroethylene copolymer (I) has may all be identical to each other or may be different from each other. For example, the tetrafluoroethylene copolymer (I) may have all of a primary amino group, a tertiary amino group and a quaternary ammonium group.

Since the precision filter for a circuit board production process liquid according to the present invention contains the tetrafluoroethylene copolymer (I) having an amino group in a side chain, the hydrophilicity thereof is comparatively high, and also a decrease in the filtration efficiency caused by generation of foams during the filtration is inhibited. In addition to the viewpoint of affinity to water, there is a possibility that the above amino group effectively adsorbs a fine foreign substance in a semiconductor cleaning liquid due to electric charge. It is therefore preferred to use the tetrafluoroethylene copolymer (I) containing a quaternary ammonium group, particularly when a semiconductor cleaning liquid is alkaline.

The ratio of the side chain to be introduced which contains an amino group may be appropriately adjusted. For example, the ratio of the above amino group to the above tetrafluoroethylene copolymer (I) is preferably not less than 0.1 μmol/g and not more than 10 mmol/g. When the ratio is less than 0.1 μmol/g, there may be a fear that the affinity to a circuit board production process liquid to be filtered may decrease, and effective filtration may not be carried out. On the one hand, the ratio is preferably not more than 10 mmol/g, since there may be a fear that resistance may decrease when the ratio is too large.

The polymerization degree of the tetrafluoroethylene copolymer (I) may be appropriately adjusted. For example, when the molecular weight of the tetrafluoroethylene copolymer (I) is too small, there may be a fear that the strength of the obtained filter may not be sufficiently ensured. On the one hand, when the molecular weight is too large, there may be a fear that the molding may become difficult.

The above amino group may be directly bonded to the main chain of the tetrafluoroethylene copolymer (I), and alternatively may be bonded to the main chain via a linker group. Such a linker group has a function such as facilitating the production of the tetrafluoroethylene copolymer (I) and enhancing the degree of freedom of the position of the amino group thereby to let the effect thereof be exhibited with more certainty.

The above linker group may be suitably selected and may be exemplified by a $C_{1-6}$ alkylene group, a $C_{1-6}$ fluoroalkylene group, an amino group (—NH—), an imino group (>C=N— or —N=C<), an ether group (—O—), a thioether group (—S—), a carbonyl group (—C(=O)—), a thionyl group (—C(=S)—), an ester group (—C(=O)—O— or —O—C(=O)—), an amide group (—C(=O)—NH— or —NH—C(=O)—), a sulfoxide group (—S(=O)—), a sulfonyl group (—S(=O)$_2$—), a sulfonylamide group (—NH—S(=O)$_2$— or —S(=O)$_2$—NH—), and a group which is formed by bonding two or more of the above groups each other. When the above linker group is constructed by bonding of two or more of the above groups, the number of bonding is preferably not more than 30 or not more than 25, and more preferably not more than 20 or not more than 15.

The raw material of the precision filter for a circuit board production process liquid according to the present invention may be substantially made of the tetrafluoroethylene copolymer (I) alone besides an unavoidable impurity, or alternatively, other resin material may be used in addition to the tetrafluoroethylene copolymer (I). The resin material which can be used in the present invention other than the tetrafluoroethylene copolymer (I) may be exemplified by polytetrafluoroethylene, polyvinylidene fluoride, nylon, polysulfone, cellulose, polyethylene and the like. The resin material other than the tetrafluoroethylene copolymer (I) is preferably a fluororesin from the viewpoint of resistance, and polytetrafluoroethylene is particularly preferred.

When other resin material is used in combination in addition to the tetrafluoroethylene copolymer (I), the filter material may be a mixture of the materials; however, at least the surface of the filter is preferably made of the tetrafluoroethylene copolymer (I) in order that resistance, wettability and the capability of capturing a fine impurity which are obtained by the tetrafluoroethylene copolymer (I) may be effectively exhibited. For example, a base material of the filter may be produced with a resin material other than the tetrafluoroethylene copolymer (I), and the filter base material may be coated with the tetrafluoroethylene copolymer (I).

The tetrafluoroethylene copolymer (I) according to the present invention can be produced by copolymerizing tetrafluoroethylene ($F_2C=CF_2$) with a fluoroolefin substituted by a side chain which contains an amino group or by a group for forming the side chain. The fluoroolefin is represented by $F_2C=CF-R$, wherein R is a side chain which contains an amino group or a group for forming the side chain containing an amino group. The copolymerization can be carried out by a method known to a person skilled in the art.

The above group for forming the side chain containing an amino group may be exemplified by a precursor group of the above amino group, and a reactive functional group for forming the above linker group. The above precursor group of the amino group may be exemplified by a cyano group and an aldehyde group. A cyano group can be transformed to a primary amino group by reduction. An aldehyde group can be transformed to a primary amino group, a secondary amino group or a tertiary amino group by reductive amination reaction. A secondary amino group and a tertiary amino group can be easily obtained from a primary amino group, and a quaternary ammonium group can be easily obtained by allowing a tertiary amino group to react with a halogenated alkyl, dialkylsulfuric acid or dialkyl carbonate.

The above reactive functional group for forming the linker group can be selected by a person skilled in the art after the linker group to be formed is determined. For example, when the linker group to be formed is an ester group or an amide group, the linker group can be formed by copolymerizating a fluoroolefin which has a substituent containing a carboxy group or an ester group and thereafter performing ester interchange reaction, or esterification reaction or amidation reaction using an acid halide or an active ester group. When the linker group to be formed is a sulfonamide group, the linker group can be formed by copolymerizating a fluoroolefin which has a substituent containing a sulfonyl halide such as sulfonyl fluoride and thereafter performing sulfonamidation reaction. In addition, the amino group may be introduced by allowing a multifunctional amine compound to react with a reactive functional group such as a carboxy group, an ester group or a sulfonyl fluoride group.

The multifunctional amine compound used in the present invention refers to a compound which has two or more amino groups in one molecule and of which at least one amino group is a primary amino group or a secondary amino group. The multifunctional amine compound may be exemplified by ethylenediamine, 1,4-diaminobutane, 1,6-diaminohexane, N,N-dimethylaminoethylamine, N,N-dimethylaminopropylamine, diethylenetriamine, triethylenetetramine, dipropylenetriamine, methyliminobisethylamine, methyliminobispropylamine, tris(2-aminoethyl)amine, polyethyleneimine and polyallylamine.

The halogenated alkyl for transforming a tertiary amino group into a quaternary ammonium group may be exemplified by methyl chloride, methyl iodide, ethyl chloride, butyl chloride, butyl bromide and benzyl chloride. The dialkylsulfuric acid may be exemplified by dimethylsulfuric acid, diethylsulfuric acid and dibutylsulfuric acid. The dialkyl carbonate may be exemplified by dimethyl carbonate, diethyl carbonate and dibutyl carbonate. As another method for obtaining a quaternary ammonium group, there is a method including the steps of obtaining the tetrafluoroethylene copolymer (I) having a primary amino group or a secondary amino group in a side chain and thereafter allowing the resultant to react with a quaternary salt of methyl chloride-dimethylaminoethyl acrylate, a quaternary salt of methyl chloride-diethylaminoethyl acrylate, a quaternary salt of methyl chloride-dimethylaminopropylacrylamide and the like.

As described above, the raw material of the precision filter for a circuit board production process liquid according to the present invention may be substantially made of the tetrafluoroethylene copolymer (I) alone besides a unavoidable impurity, or alternatively, other resin material may be used in addition to the tetrafluoroethylene copolymer (I).

In the case where the precision filter for a circuit board production process liquid according to the present invention is produced substantially from the tetrafluoroethylene copolymer (I) alone, for example, the tetrafluoroethylene copolymer (I) may be molded into a membrane shape and thereafter subjected to biaxial stretching, thereby to form a porous membrane having a microstructure characterized by nodal points interconnected with fibril.

The precision filter for a circuit board production process liquid according to the present invention may be one in which a filter base material having a precision porous structure is coated with the tetrafluoroethylene copolymer (I). Even when the raw material of the filter base material is a resin material other than tetrafluoroethylene, a method of making the resin material into a porous membrane is known in the art. In such a case, the resin material may be processed into a filter base material having a precision porous structure by a known method, and thereafter coated using a solution containing the tetrafluoroethylene copolymer (I).

The precision filter for a circuit board production process liquid according to the present invention may have either a single-layer structure or a multiple-layer structure. In the case of the single-layer structure, the filter thickness may be suitably adjusted, and the filter thickness is preferably not less than 1 μm and not more than 200 μm. When the thickness is 1 μm or more, a sufficient strength can be ensured with more certainty as a precision filter for a circuit board production process liquid. On the one hand, when the thickness is too large, the effective filtration area of the filter decreases in the cartridge, thereby raising a fear that the filtration speed may decrease. The thickness is therefore preferably 200 μm or less. Also, not less than two sheets and not more than ten sheets of the above single-layer filter may be laminated. In the case of forming a laminate having a multiple-layer structure, the thickness, the pore diameter, the side-chain functional group and the like of each single-layer filter may be the same or different from each other. The total thickness of the laminate is preferably not less than 2 μm and not more than 200 μm. Such a laminate may be reinforced with a drainage layer. A drainage layer refers to a woven cloth or a net made of polytetrafluoroethylene, tetrafluoroethylene-perfluoroalkylvinylether copolymer or the like. The precision filter for a circuit board production process liquid may be pleated before being inserted into a filter cartridge.

The pore diameter of the precision filter for a circuit board production process liquid according to the present invention may be suitably adjusted, and the pore diameter is preferably not less than 1 nm and not more than 200 nm. Though the pore diameter may be directly measured, the pore diameter may as well be determined by an indirect method such as a bubble point method.

When a strongly acidic or strongly alkaline circuit board production process liquid is filtered, damage is given to the filter and additionally, the contamination of a foreign substance is not permitted in the circuit board production process liquid. Accordingly, a filter cartridge which can be placed in a filtration passageway of a circuit board production process liquid is convenient. In the case of such a cartridge, the filter can be easily replaced at appropriate times. The filter cartridge according to the present invention is formed to have a shape which accords to the applied filtration passageway for the circuit board production process liquid, and has the precision filter for a circuit board production process liquid according to the present invention in an internal flow passageway.

The precision filter for a circuit board production process liquid according to the present invention and the precision filter cartridge for a circuit board production process liquid according to the present invention described above have an extremely high resistance and hence can filtrate even a strongly acidic or strongly alkaline circuit board production process liquid and can remove a fine foreign substance. Accordingly, a semiconductor circuit board with reduced adhesion of a foreign substance or the like can be produced by forming one or more selected from the group consisting of a circuit, a semiconductor and a semiconductor precursor on a circuit board with use of a circuit board production process liquid which is filtered by the above filter or filter cartridge according to the present invention.

The circuit board production process liquid to be filtered with use of the precision filter for a circuit board production process liquid or the precision filter cartridge for a circuit board production process liquid according to the present invention is not particularly restricted as long as the liquid is used for production of a circuit board, and the liquid may be exemplified by a photolithography material liquid such as a photoresist solution, a developing liquid and an etching liquid, and a cleaning liquid.

The present application claims the benefit of the priority date of Japanese patent application No. 2015-154539 filed on Aug. 4, 2015. All of the contents of the Japanese patent application No. 2015-154539 filed on Aug. 4, 2015, are incorporated by reference herein.

EXAMPLES

Hereinafter, the present invention is described in more detail with Examples. However, the present invention is not restricted to the following Examples in any way, and it is possible to work the present invention in accordance with the Examples with an additional appropriate change within the range of the above descriptions and the following descriptions. Such a changed embodiment is also included in the technical scope of the present invention.

Example 1: Production of Precision Filter Made of Tetrafluoroethylene Copolymer Having Side Chain Containing Primary Amino Group (1) Production of TFE Copolymer Membrane On the basis of Example 5 and Example 9 of JP 2013-538281 T, a membrane made of tetrafluoroethylene copolymer having a sulfonyl fluoride side chain was produced. Hereafter, a tetrafluoroethylene copolymer is abbreviated as "TFE copolymer". The physical properties of the obtained TFE copolymer membrane are shown in Table 1.

TABLE 1

| Mass/Area | 5.1 g/m$^2$ |
| Thickness | 10 μm |
| Gurley permeability | 8.2 seconds |

TABLE 1-continued

| Bubble point | 460 kPa |
| Average strength of matrix | 200 MPa |

(2) Introduction of Amino Group

The TFE copolymer membrane (0.2 g) obtained in the above (1) was immersed into a reaction liquid consisting of ethylene glycol dimethyl ether (12 g) and tris(2-aminoethyl) amine (0.35 g) at 70° C. for 5 hours. The TFE copolymer membrane was washed using deionized water until the pH value of the cleaning water became 8 or less. Subsequently, the TFE copolymer membrane was washed again using a mixed solution of ion-exchange water/isopropyl alcohol=50/50 by mass. The membrane was dried at 40° C. for 1 hour using a warm-air dryer to obtain a TFE copolymer precision filter to which tris(2-aminoethyl)amine is bonded.

The obtained TFE copolymer precision filter was analyzed by FT-IR. As a result, it was confirmed that the peak of a sulfonyl fluoride group attributed to about 1469 cm$^{-1}$ was decreased and a sulfonamide group attributed to about 1377 cm$^{-1}$ was generated.

Example 2: Production of Precision Filter Made of Tetrafluoroethylene Copolymer Having Side Chain Containing Quaternary Ammonium Chloride Group The TFE copolymer precision filter (0.2 g) which was obtained in the above Example 1 and into which primary amino groups were introduced was immersed in a reaction liquid consisting of isopropyl alcohol (3.5 g) and a quaternary salt of dimethylaminopropylacrylamide-methyl chloride (1.6 g) at 80° C. for 24 hours. Subsequently, the TFE copolymer precision filter was washed with a mixed solution of ion-exchange water/isopropyl alcohol=50/50 by mass at room temperature in order to remove unreacted quaternary salt of dimethylaminopropylacrylamide-methyl chloride. The resultant was dried at 40° C. for 1 hour using a warm-air dryer to obtain a TFE copolymer precision filter to which quaternary ammonium groups were introduced by bonding a quaternary salt of dimethylaminopropylacrylamide-methyl chloride to a part of the primary amino groups.

The obtained TFE copolymer precision filter was analyzed by chlorine analysis. As a result, it was confirmed that a quaternary ammonium chloride group was introduced since 200 ppm of chlorine was contained in the membrane.

Example 3: Resistance Test

A strongly acidic cleaning liquid or a strongly alkaline cleaning liquid is often used for cleaning of a semiconductor or a circuit board; therefore, resistance to a strong acid or a strong alkali is demanded in a filter used for filtrating such cleaning liquids. Accordingly, the resistance of the filter was tested.

Figure 2:
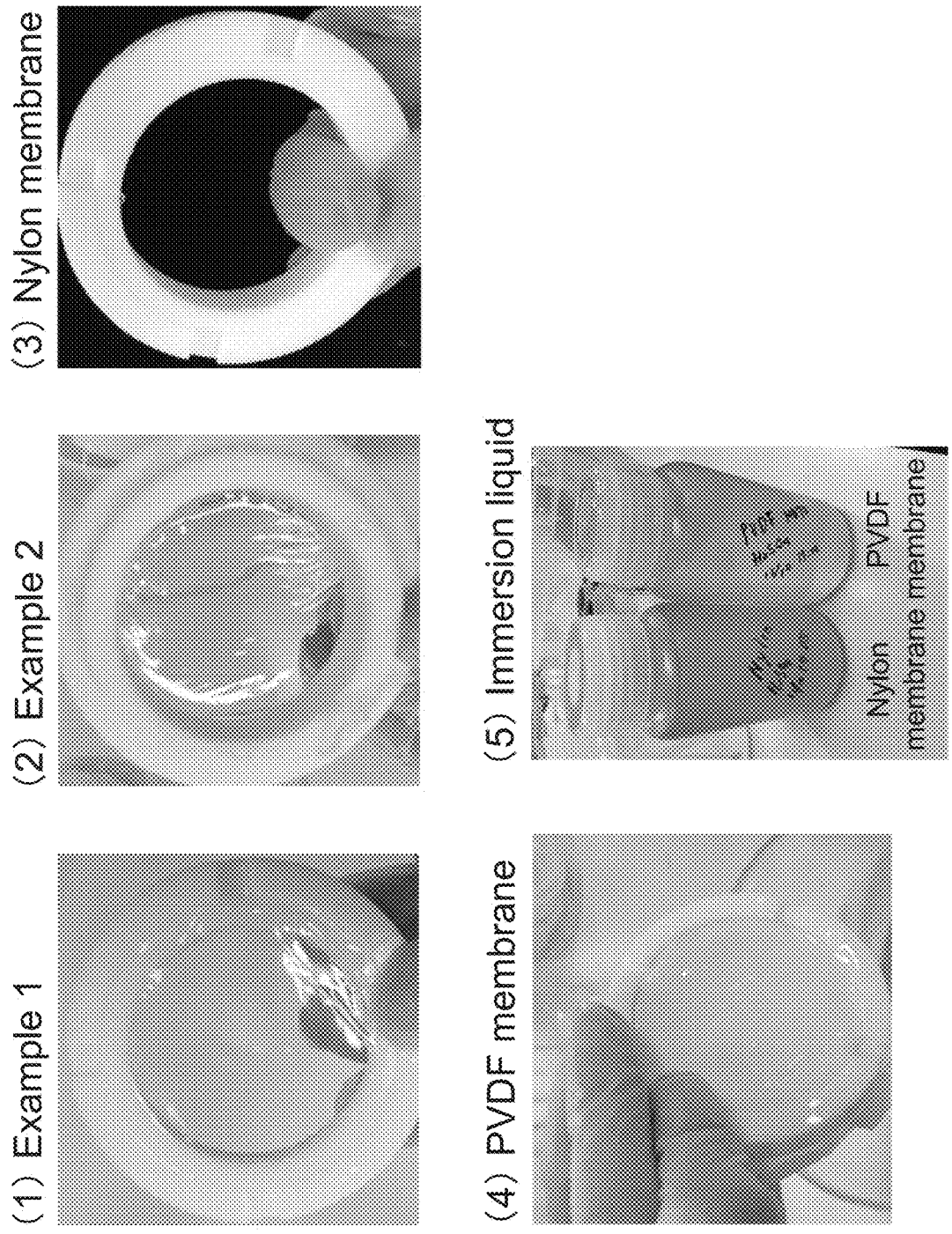
FIG. 2 are photographs showing an appearance of filter samples after the filter samples were immersed into concentrated sulfuric acid.
Figure 3:
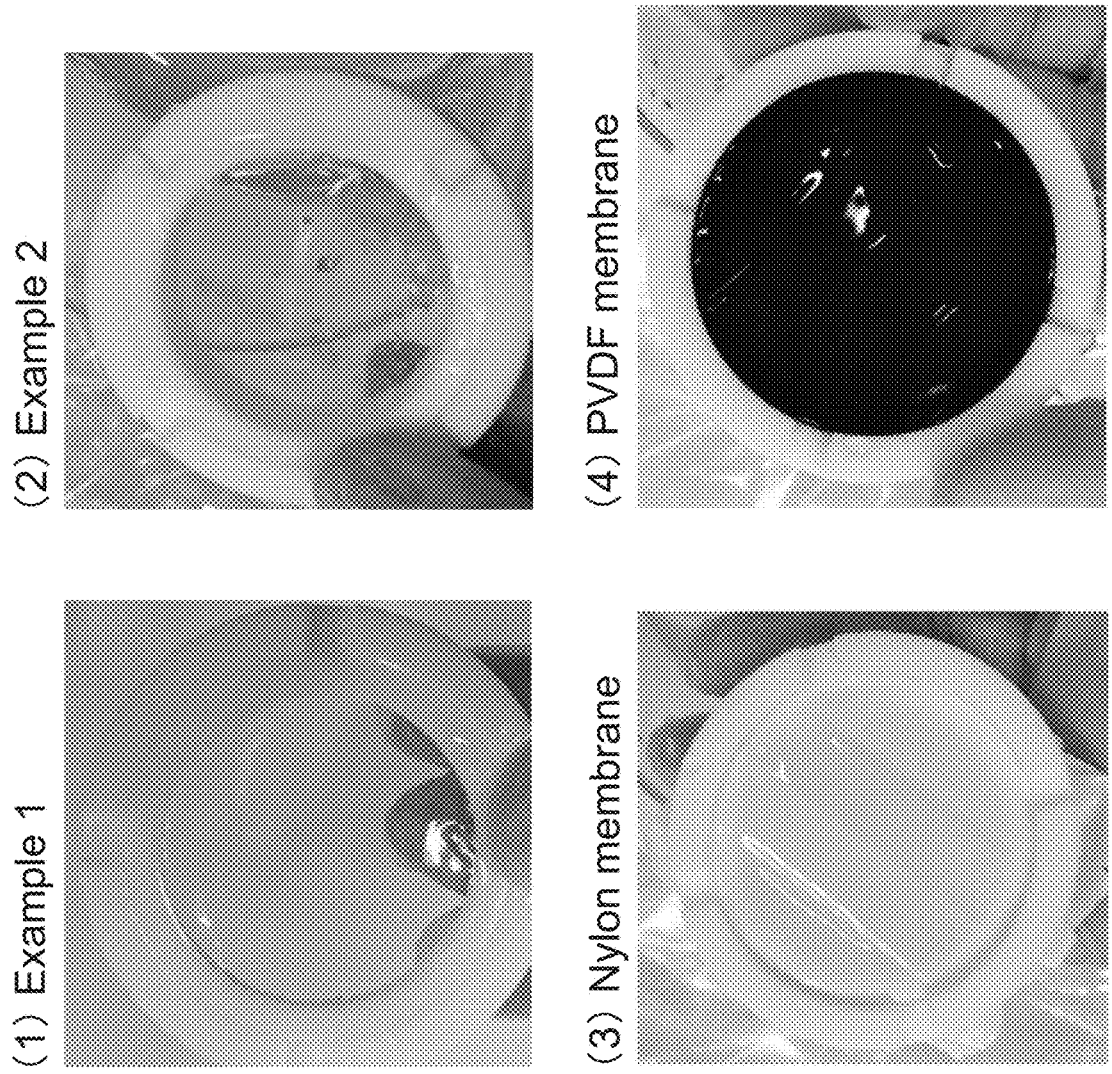
FIG. 3 are photographs showing an appearance of filter samples after the filter samples were immersed into a concentrated aqueous solution of sodium hydroxide.

The TFE copolymer precision filters produced in the above Example 1 and Example 2 were cut to 5 cm×5 cm, and each filter was inserted and fitted into a 50 mmφ double frame made of PTFE (manufactured by Kitamura Manufacturing Co., Ltd.) to form samples. The samples were immersed into 96% concentrated sulfuric acid or 30% aqueous solution of sodium hydroxide at ordinary temperature for 3 days, and thereafter washed with water. Also, for comparison, a commercially available hydrophilic nylon 66 membrane having a thickness of 195 μm ("LifeASSURE™" manufactured by 3M Co., Ltd.) and a hydrophilic polyvinylidene fluoride membrane having a thickness of 125 μm ("Charged Durapore" manufactured by Millipore Co., Ltd.) were tested in a similar manner. FIG. 1 shows photographs of each sample before the test; FIG. 2 shows a result of immersion into concentrated sulfuric acid and a photograph of concentrated sulfuric acid into which the nylon membrane and the polyvinylidene fluoride (PVDF) membrane was immersed; and FIG. 3 shows a result of immersion into a concentrated aqueous solution of sodium hydroxide. In FIG. 2, (3) shows a photograph of the nylon membrane after several minutes passed from the start of immersion, and (4) shows a photograph of the PVDF membrane after about one hour passed from the start of immersion.

As shown in FIG. 2, when the nylon membrane was immersed into concentrated sulfuric acid, the nylon membrane disappeared by being completely dissolved as quickly as several minutes; and when the PVDF membrane was immersed into concentrated sulfuric acid, the PVDF membrane underwent color change in about one hour; and the color of each immersion liquid turned to brown. As shown in FIG. 3, although no color change was recognized when the nylon membrane was immersed into a concentrated aqueous solution of sodium hydroxide, the nylon membrane was swelled and was liable to come off from the PTFE double frame. The tensile strength was measured; and as a result, it was found out that the tensile strength decreased by as much as about 66.4% from 6.27 N before the immersion to 2.11 N after the immersion. When the PVDF membrane was immersed into a concentrated aqueous solution of sodium hydroxide, the PVDF membrane underwent color change in about one hour, and the color thereof completely turned to black in about three hours.

In contrast, even in both of the cases where the TFE copolymer precision filter into which a side chain containing a primary amino group was introduced and the TFE copolymer precision filter into which a side chain containing a quaternary ammonium group was introduced according to the present invention were immersed into concentrated sulfuric acid and a concentrated aqueous solution of sodium hydroxide, the membrane shape and the transparency of the filters were maintained, and also no color change was recognized in the immersion liquid. From the result, it was clear that the TFE copolymer precision filters have a high resistance to both strongly acidic and strongly alkaline environments. In FIG. 1, the filters of the present invention do not appear to be transparent, since the filters were in a dry state before the immersion; however, when the filters are immersed into a liquid, the filters become transparent since the pores are filled with the liquid.

Example 4: Fine Particle Capture Test

A liquid which contained fluorescent polystyrene fine particles having a particle size of 50 nm ("B50 Fluoro-max" manufactured by Thermo Co., Ltd., 28.8 µL) was dispersed into a 0.1% aqueous solution (1 L) of a nonionic surfactant ("Triton X-100" manufactured by The Dow Chemical Company). The TFE copolymer precision filters produced in Examples 1 and 2 according to the present invention, and the nylon membrane and the PVDF membrane used in the above Example 3 were placed in a 25 mmφ plastic holder (manufactured by ADVANTEC Co., Ltd.), and the above dispersion liquid was passed through the filters at a pressure of 40 kPa to be filtered. The fluorescence degrees of the dispersion liquid before and after the filtration were measured using a fluorospectrophotometer ("RF-1500" manufactured by Shimadzu Corporation), and the capture efficiency for the fine particles was calculated in accordance with the following formula.

100−[{(fluorescence degree of dispersion liquid after filtration)/(fluorescence degree of dispersion liquid before filtration)}×100]

In addition, each of the above membranes was immersed into concentrated sulfuric acid or a concentrated aqueous solution of sodium hydroxide at an ordinary temperature for three days in the same manner as in the above Example 3, and thereafter washed with pure water. Then, the capture efficiency was measured in the same manner as described above. In the case where the nylon membrane was immersed into concentrated sulfuric acid, the capture test could not be carried out since the nylon membrane was completely dissolved. The results are shown in FIG. 4.

Figure 4:
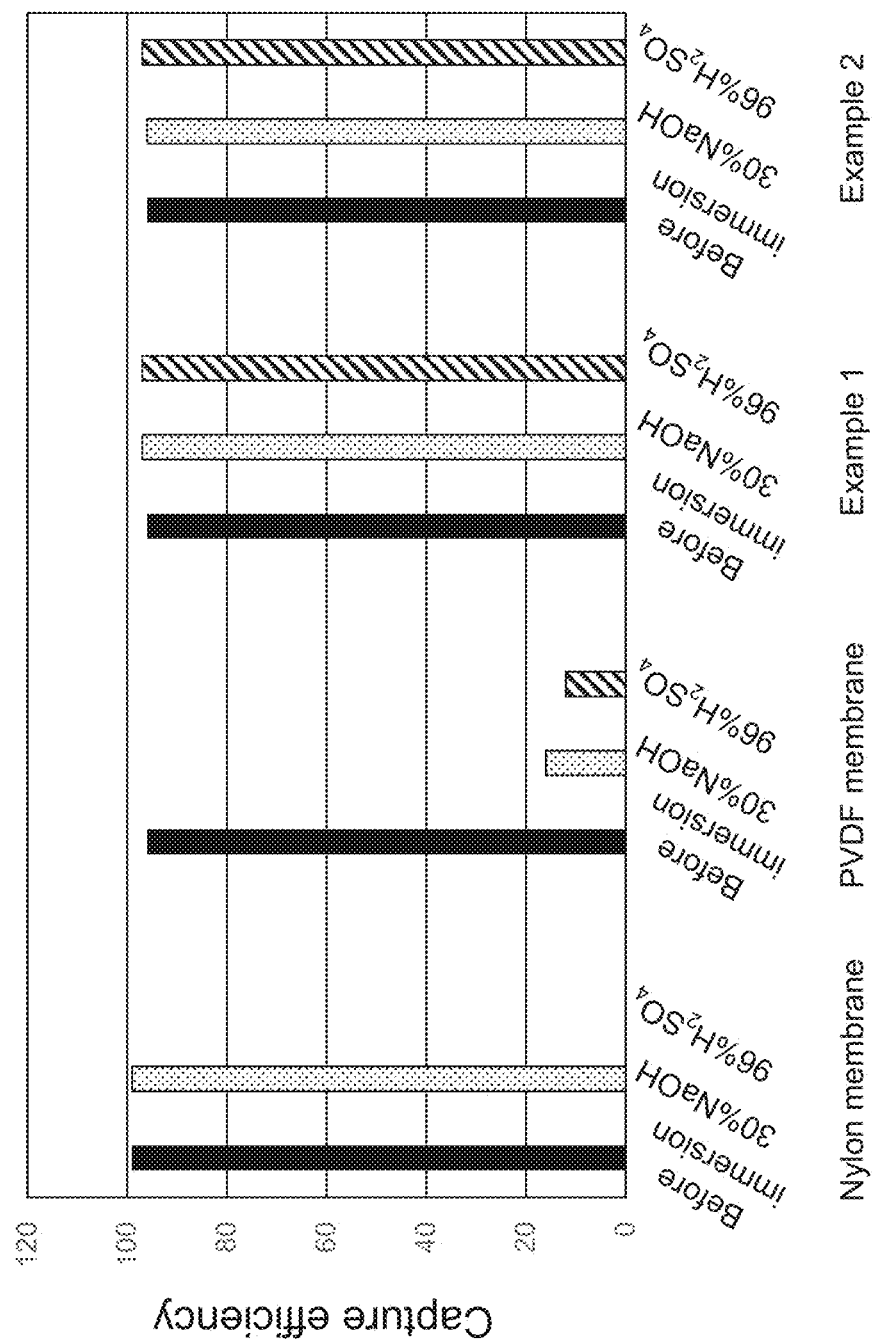
FIG. 4 is a graph showing a fine particle capturing efficiency of filter samples before and after immersion into a concentrated sulfuric acid or concentrated aqueous solution of sodium hydroxide.

As the results shown in FIG. 4, the fine particle capture efficiency of the nylon membrane was maintained even after immersion into a concentrated aqueous solution of sodium hydroxide; however, deterioration of mechanical strength was recognized, and moreover, the nylon membrane is dissolved into concentrated sulfuric acid. The nylon membrane is therefore not suitable for filtration of a circuit board production process liquid. With respect to the PVDF membrane, the capture efficiency for the fine particles considerably decreases due to both the treatment with concentrated sulfuric acid and the treatment with a concentrated aqueous solution of sodium hydroxide. Accordingly, the PVDF membrane cannot be used for filtration of a circuit board production process liquid, into which the contamination of even a slight amount of a fine impurity is not permitted. The cause thereof seems to be that the pores were enlarged since the PVFD membrane was damaged by concentrated sulfuric acid and a concentrated aqueous solution of sodium hydroxide.

In contrast, in the case of the TFE copolymer precision filter into which a side chain containing an amino group was introduced according to the present invention, the capture efficiency for the fine particles did not decrease at all even after passing through both the treatment with concentrated sulfuric acid and the treatment with a concentrated aqueous solution of sodium hydroxide which were carried out for as long as three days. Thus, it was demonstrated that the TFE copolymer precision filter into which a side chain containing an amino group was introduced according to the present invention is extremely suitable for filtration of a circuit board production process liquid due to a high resistance to strong acid and strong alkali.

The invention claimed is:
1. A device comprising:
 a filter, wherein the filter comprises:
  a tetrafluoroethylene copolymer comprising:
   a main chain; and
   a side chain;
    wherein the side chain comprises:
     a sulfonyl group or a sulfonyl amide group,
     a linker comprising a secondary amino group or a tertiary amino group, and
     a quaternary ammonium;
      wherein the quaternary ammonium of the side chain is bonded to the main chain of the tetrafluoroethylene copolymer by the linker;
     wherein a ratio of the quaternary amino group to a mass of the tetrafluoroethylene copolymer is not less than 0.1 µmol/g and not more than 10 mmol/g.

2. The device according to claim 1, the filter having a double-layered structure of a base material layer and a coating layer, wherein the coating layer comprises the tetrafluoroethylene copolymer.

3. The device according to claim 2, wherein the base material layer comprises polytetrafluoroethylene.

4. The device according to claim 1, wherein the device is a filter cartridge comprising the filter according to claim 1.

* * * * *